United States Patent
Sikora

[19]

[11] Patent Number: 6,011,405
[45] Date of Patent: Jan. 4, 2000

[54] APPARATUS AND METHOD FOR PROBING MULTIPLE INTEGRATED CIRCUIT DICE IN A SEMICONDUCTOR WAFER

[75] Inventor: Robert M. Sikora, San Jose, Calif.

[73] Assignee: Qualitau, Inc., Sunnyvale, Calif.

[21] Appl. No.: 08/959,065

[22] Filed: Oct. 28, 1997

[51] Int. Cl.[7] .................................................. G01R 31/02
[52] U.S. Cl. .......................................... 324/765; 324/754
[58] Field of Search ........................... 324/765, 760–762, 324/72.5, 754

[56] References Cited

U.S. PATENT DOCUMENTS

| | | | |
|---|---|---|---|
| 5,003,254 | 3/1991 | Hunt et al. | 324/754 |
| 5,012,187 | 4/1991 | Littlebury | 324/754 |
| 5,463,325 | 10/1995 | Fujii | 324/761 |
| 5,670,889 | 9/1997 | Okubo et al. | 324/760 |

*Primary Examiner*—Josie Baliato
*Assistant Examiner*—Minh Tang
*Attorney, Agent, or Firm*—Townsend and Townsend and Crew LLP; Henry K. Woodward

[57] ABSTRACT

Multiple integrated circuit dice can be simultaneously engaged for probe testing by providing a wedge card having a plurality of needle probes mounted thereon and extending along two orthogonal directions with the probe cards being planarized below a first major surface. Each wedge card can then engage at least two integrated circuits simultaneously. The wedge cards and manipulators can be mounted on a probe card around a central opening for testing integrated circuit die through the opening, alternatively, the probe card and manipulator can be mounted to two movable rods attached to respective pairs of manipulators mounted on a platen around the semiconductor wafer with the rods and manipulators moving the wedge card and manipulator along two axes (X,Y) with the wedge card manipulator moving the wedge card in a third axis (Z). Multiple integrated circuits can be simultaneously tested, and the manipulators for controlling the needle probes on a wedge card are distributed around the semiconductor wafer and away from heat generated by the integrated circuits undergoing tests. Further, the distributed manipulators can control a plurality of wedge cards in the two axes (X,Y).

7 Claims, 8 Drawing Sheets

APPARATUS AND METHOD FOR PROBING MULTIPLE INTEGRATED CIRCUIT DICE IN A SEMICONDUCTOR WAFER

BACKGROUND OF THE INVENTION

This invention relates generally to the testing of electrical circuits, and more particularly, the invention relates to the probe testing of integrated die in a semiconductor wafer.

Semiconductor integrated circuits are fabricated in a batch process where a plurality of identical integrated circuits are formed in a single wafer of silicon. Prior to scribing and breaking the wafer into individual integrated circuit die, each of the circuits is electrically tested so that defective circuits can be marked and subsequently discarded.

Heretofore, electrical parametric testers have tested die serially because it is easier and most test times are short enough to allow serial testing of individual circuits. As shown in FIGS. 1A, 1B, the conventional tester includes a probe card which is essentially a small printed circuit board 10 with a hole 12 through which needle probes 14 extend to engage contacts on an integrated circuit. The printed circuit board traces 16 electrically connect the probes to the tester. See for example, U.S. Pat. No. 3,613,001. The probe needles access bonding pads 20 of a die 22 on a wafer 24, as illustrated in FIG. 2.

However, some integrated circuits require test times not measured in seconds or minutes, but rather in days, weeks, or months. The serial testing of such individual die is not feasible. Printed circuit probe cards with multiple openings for needle probes have been proposed for testing these integrated circuits, but such cards have problems of alignment and planarity.

The bond pads which the probes are contacting are typically no larger than 100 $\mu$m on the side. Needle probes have a tendency to move slightly through repeated use. This can cause the probes to become misaligned with respect to each other and with respect to the bond pads on the wafer. This is a sizable problem with conventional probe cards. The problem is compounded many times over when the spacing between the probes becomes very large as when multiple die are probed simultaneously from the same probe card.

Further, all the probes must extend downwardly from the probe card the same distance with the tips in one plane. However, the probes have a tendency to go out of planarity which results in some probes making contact with the wafer, and some not. In addition, this problem is acerbated by temperature which is a common testing requirement. Again, this is a major problem within one die, but is compounded many times over when the spacing between probes becomes large, as when multiple die are being probed simultaneously.

Wedge cards were introduced within the past few years as a means of accessing multiple dies on a wafer simultaneously. These cards address both the issue of alignment and planarity. The wedge cards are small (i.e., 1"×1") probe cards suspended on the arm of an X,Y,Z manipulator. The wedge card typically has up to 20 needle probes with a wire cable attached thereto to bring the test signals in and out. The probes all extend from one side or edge of the wedge card. The manipulator allows precise movement in the X,Y and Z axes, and by using multiple manipulators, the user can independently probe several die simultaneously on a wafer as illustrated in FIG. 3. Because each manipulator has independent control of X, Y, and Z motions, the issues of alignment and planarity are limited to the dimensions of the individual wedge card, and not to the distance between them. However, even with this approach a limited number of wedge cards and manipulators can be used simultaneously. A primary problem is physically fitting the manipulators and wedge cards around the wafer, which limits the simultaneous testing to a maximum of eight die.

The present invention is directed to a new apparatus and method for simultaneously testing multiple integrated circuits on a semiconductor wafer.

SUMMARY OF THE INVENTION

In accordance with the invention, a multiple probe wedge card is provided for simultaneously engaging a plurality of integrated circuit dice. The wedge card body has two opposing major surfaces with a plurality of needle probes mounted on and extending from the card body in two orthogonal directions with the probes being planarized below a first major surface. A manipulator contact is centrally disposed on a second major surface whereby the plurality of needle probes are extendable from at least two sides of the body for engaging at least two integrated circuits.

In one embodiment, a manipulator is attached to each card body for individually manipulating the card body in three directions (X,Y,Z). A probe card is preferably provided for supporting a plurality of wedge cards and manipulators, the probe card having at least one opening through which needle probes extend for contacting the integrated circuit die. The manipulator for individual wedge cards can then be mounted on the probe card adjacent to the opening.

In accordance with another embodiment, a platen is provided for positioning around a semiconductor wafer, the platen including a first support rod and means for moving the first support rod in a first axis (X), a second support rod and means for moving the second support rod in a second axis (Y), with the manipulator being mounted to the first support rod and the second support rod and movable along the first axis and the second axis thereby. The manipulator then provides movement along a third axis (Z).

An advantage of the wedge cards in accordance with the invention lies in the manipulators and wedge cards not being directly above the wafer during tests, thus avoiding direct exposure to heat from the hot chuck and hot stage on which the wafer sits. This heat can be considerable as temperature is used as a major variable in such testing. Further, the test assembly can be turned upside down whereby the probes are beneath the wafer and not above the wafer. Further, the test assembly can be turned upside down whereby the probes are beneath the wafer and not above the wafer. Use of the platen allows for simultaneous positioning of multiple wedge cards along two axes (X,Y), while the individual manipulators provide individual positioning of wedge cards in the third axis (Z). Moreover, the manipulators are moved out of the area directly above the semiconductor wafer to an area where greater space is provided. Only the vertical motion control manipulator is left in the hot zone directly above the wafer undergoing tests.

The invention and objects and features thereof will be more readily apparent from the following detailed description and dependent claims when taken with the drawings.

DETAILED DESCRIPTION OF ILLUSTRATIVE EMBODIMENTS

Figure 1A:
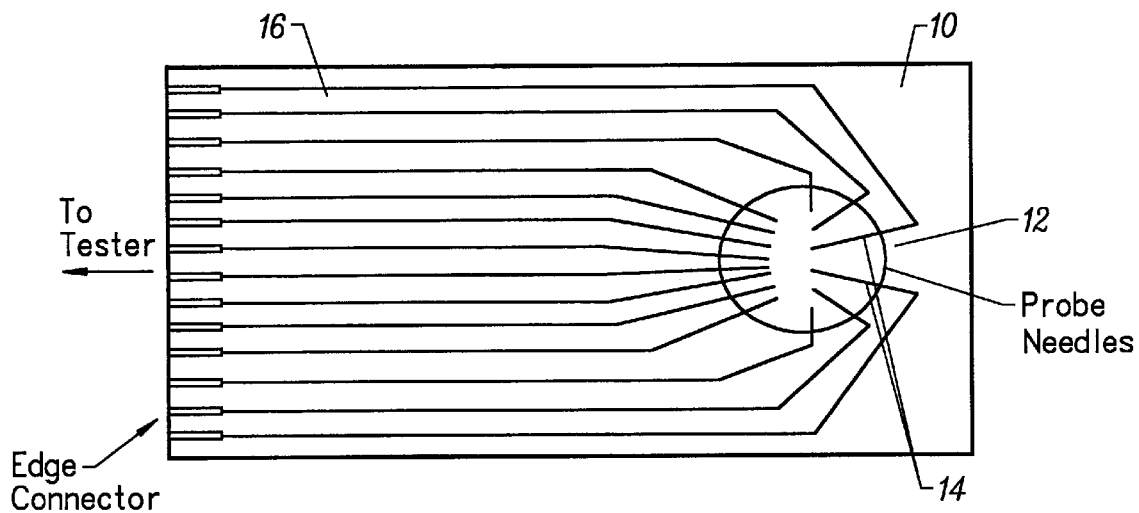
FIGS. 1A, 1B are a plan view and a side view of a conventional probe card for integrated circuit die testing.
Figure 1B:
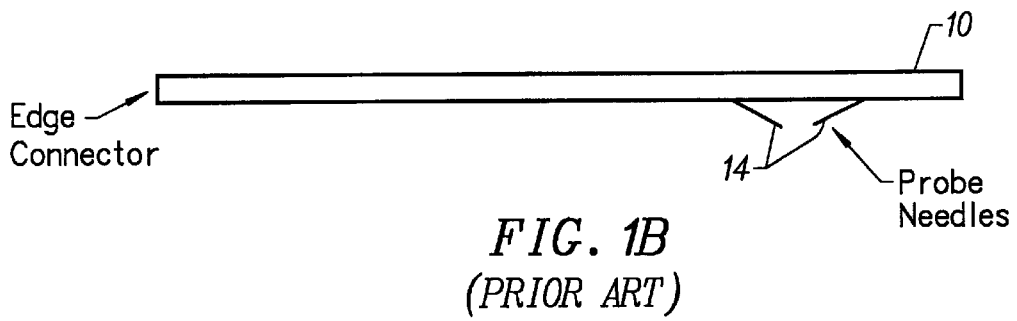
Figure 2:
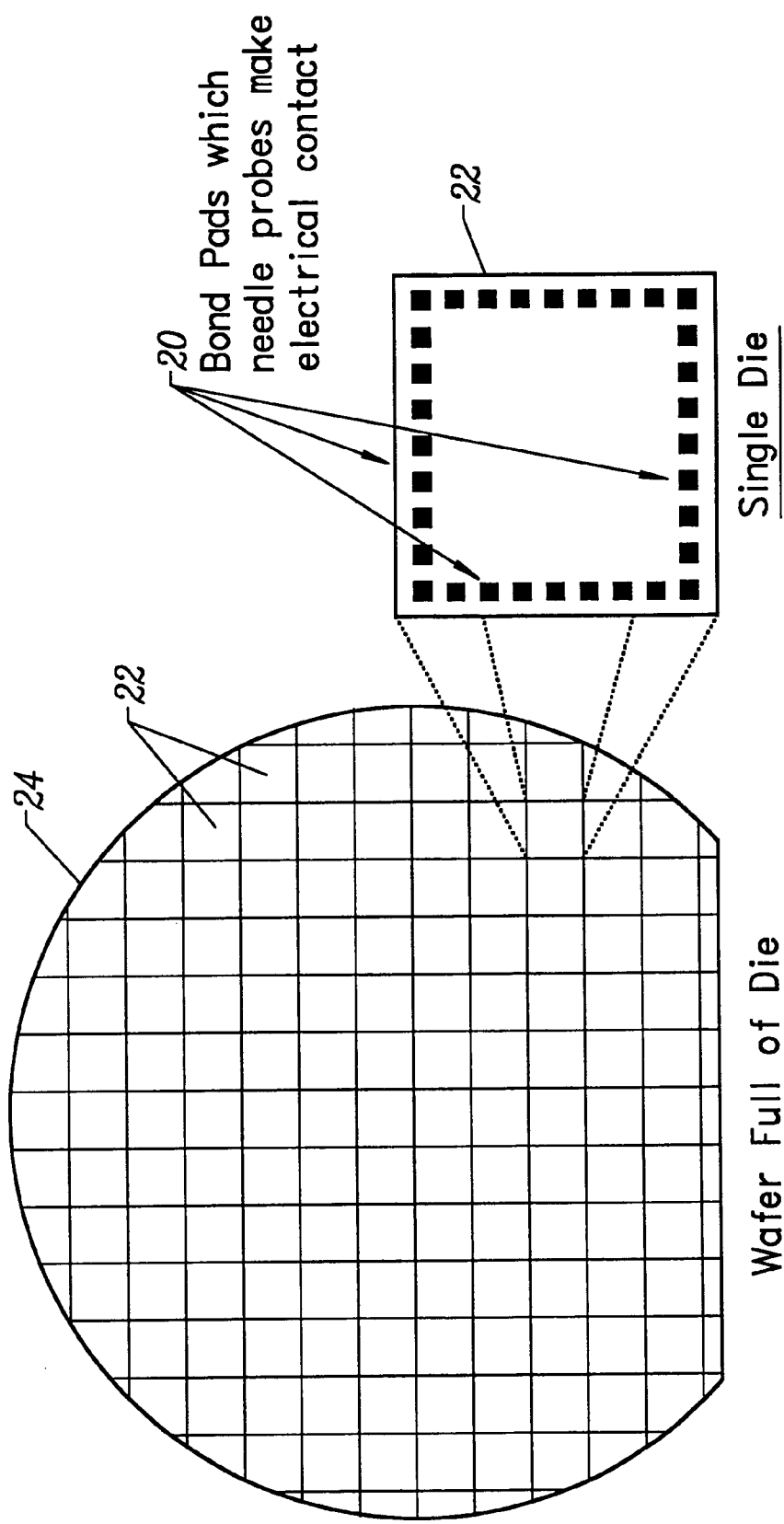
FIG. 2 is a plan view of the semiconductor wafer and a plurality of integrated circuit dice therein.
Figure 3:
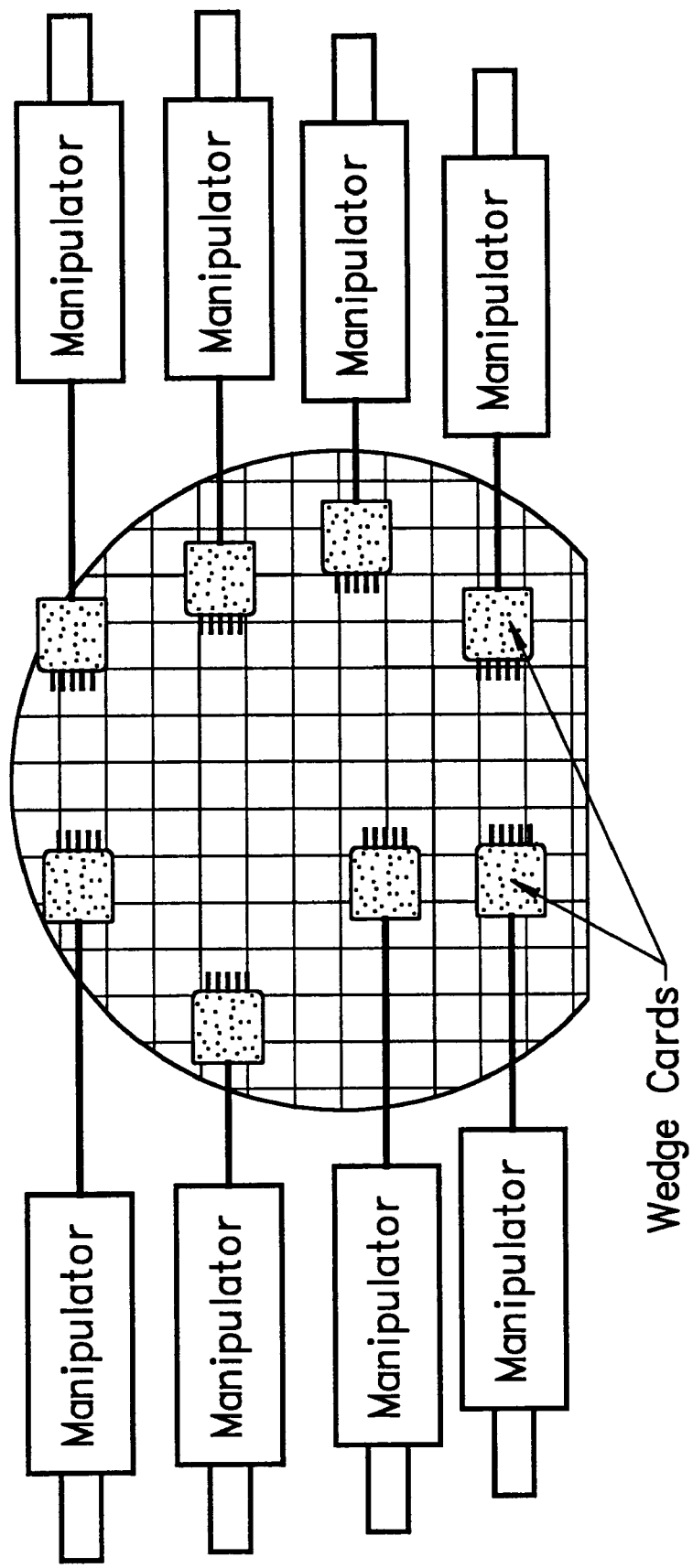
FIG. 3 is a schematic of manipulators controlling conventional wedge cards in testing a plurality of integrated circuit die in a semiconductor wafer.
Figure 4A:
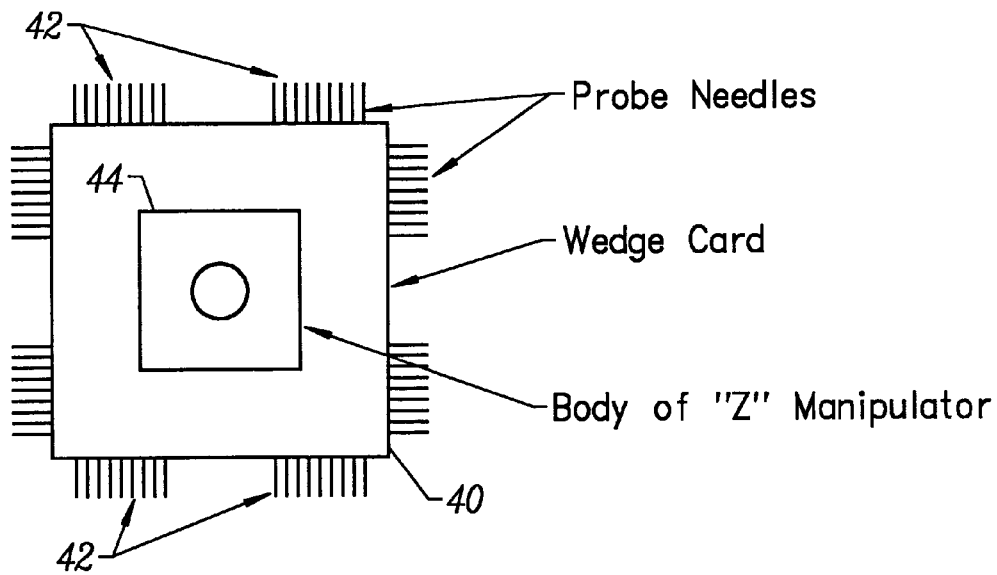
FIGS. 4A, 4B are a plan view and a side view of a wedge card and manipulator in accordance with the invention.
Figure 4B:
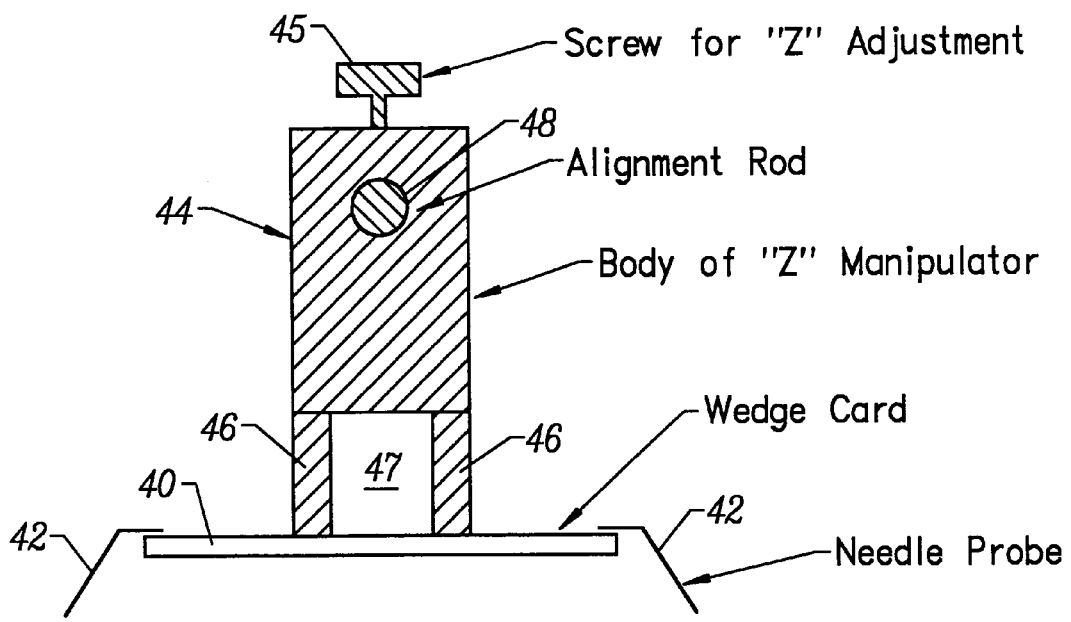

Referring to the drawings, FIGS. 4A and 4B are a plan view and a front view, respectively, of a wedge card and manipulator in accordance with the present invention. The wedge card 40 has a plurality of needle probes 42 extending from a plurality of sides, in two orthogonal directions all four sides in this embodiment, whereby the probes 42 can engage four or more integrated circuit die simultaneously. The manipulator 44 has arms 46 engaging a manipulator contact as shown generally at 47 of the wedge card 40 in a centrally disposed area which does not interfere with the positioning of the needle probes 42. A screw 45 provides vertical or Z axis adjustment, and a rod 48 through manipulator body 44 provides horizontal or X and Y axis adjustment, as will be described below. It will be appreciated that each group of probes 42 extending from a side of wedge card 40 can vary in number, and can be of variable lengths to engage contacts at different positions on an integrated circuit die. Thus, unlike the wedge card of the prior art in which a manipulator engages one side of the wedge card for positioning a single set of needle probes which can engage a single integrated circuit die, the wedge card in accordance with the present invention accommodates a plurality of sets of needle probes mounted on and extended from the cord body in two orthogonal directions with the probes being planarized below a first major surface for engaging a plurality of die.

Figure 5:
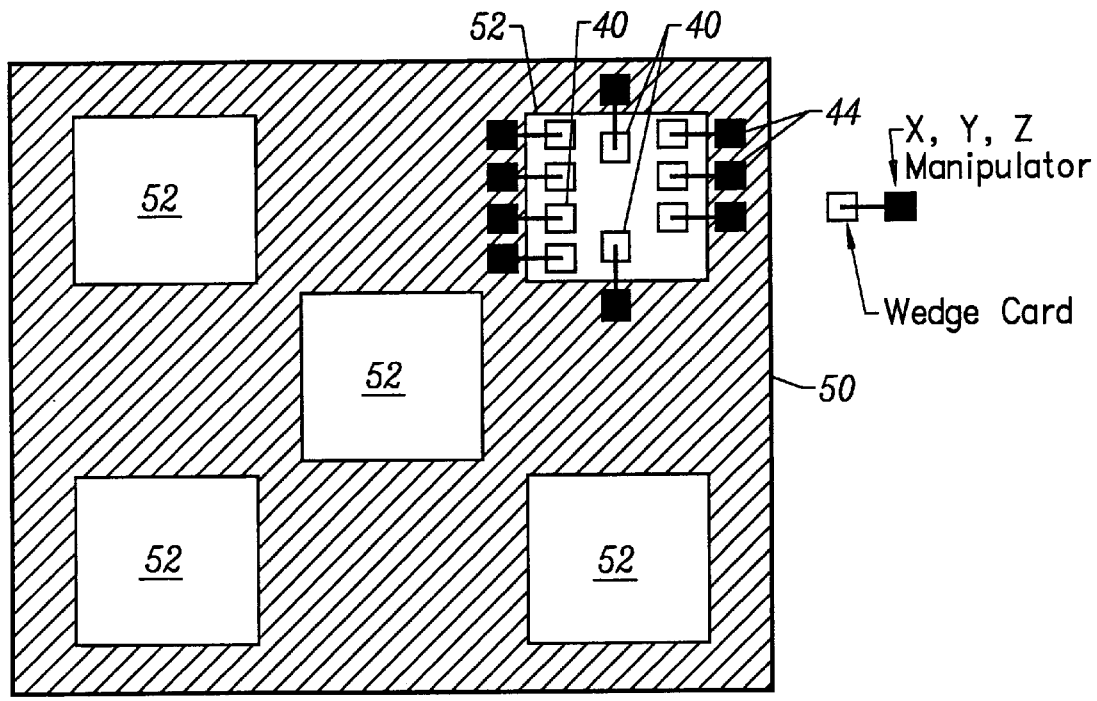
FIG. 5 is a plan view of a probe card with multiple wedge cards in accordance with one embodiment of the invention.

As shown in FIG. 5, the individual manipulators 44 can be mounted on a probe card 50 around the periphery of openings 52 through the probe card. Alternatively, as shown in FIG. 6, the probe card 50 can have a plurality of elongated slots 54 with the manipulators 44 positionable along sides of the slots for engaging contacts on integrated die in and underlying semiconductor wafer.

Figure 6:
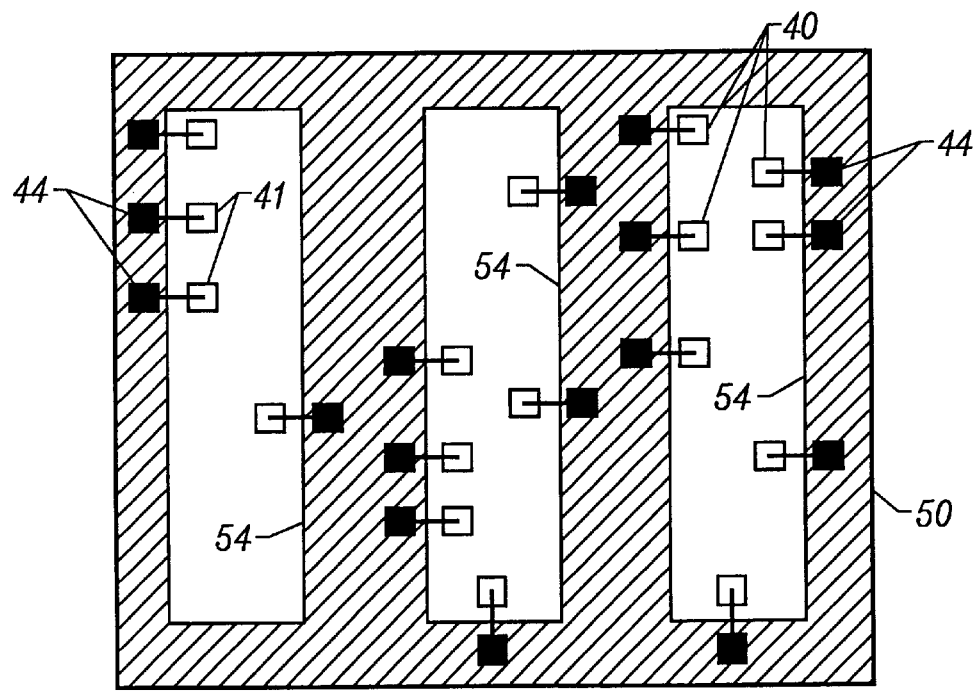
FIG. 6 is a plan view of a probe card with multiple wedge cards in accordance with another embodiment of the invention.
Figure 7:
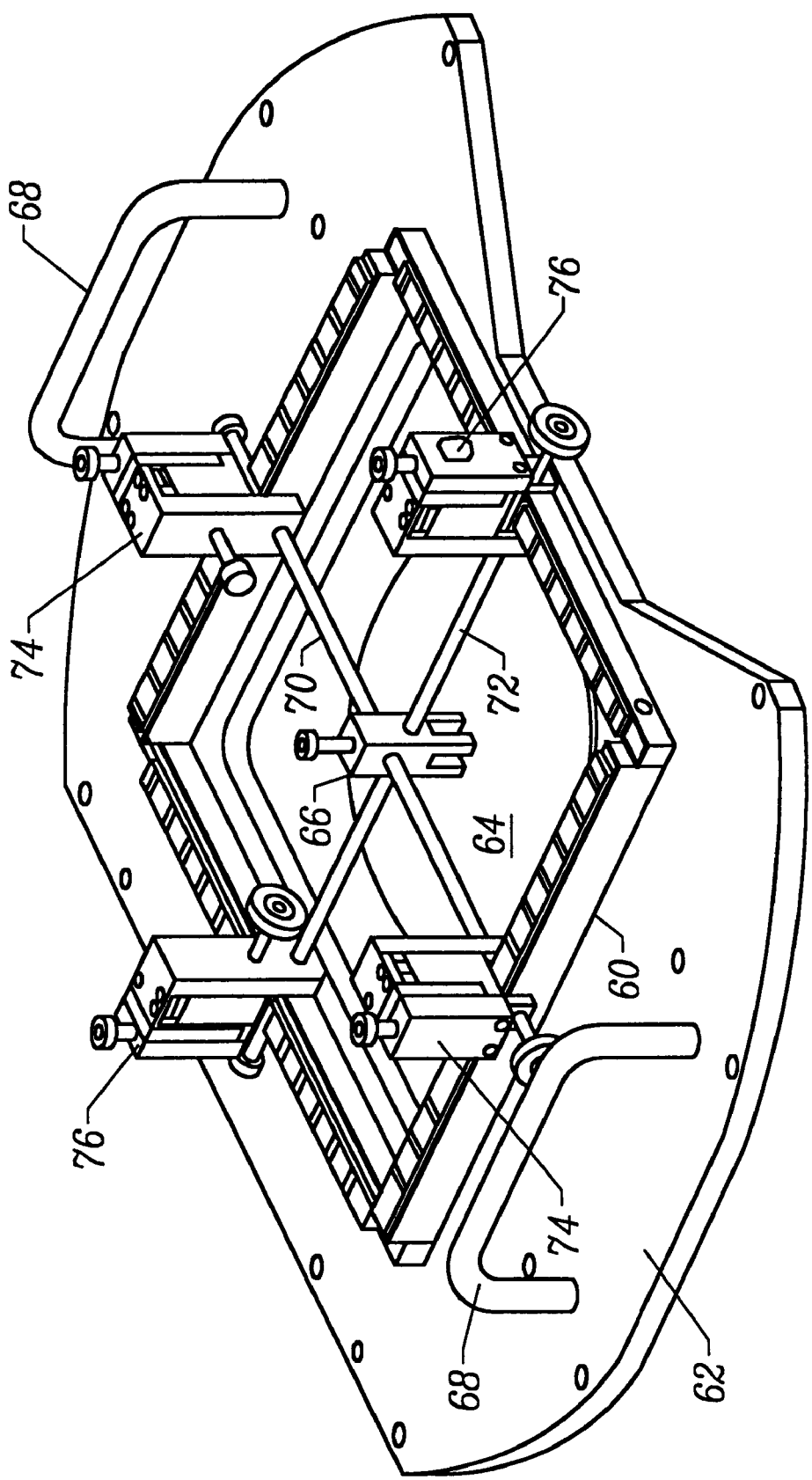
FIG. 7 is a perspective view of a platen manipulator in accordance with one embodiment of the invention.

In the embodiments of FIGS. 5 and 6 in which individual manipulators are mounted on probe cards, each wedge card is individually controlled by a manipulator, and the manipulators must be positioned above the integrated circuit die being tested which is normally at an elevated temperature. In accordance with another embodiment of the invention, a platen is provided for positioning around a semiconductor wafer thereby removing manipulators from above the semiconductor wafer and thus displaced from any elevated temperature generated thereby. FIG. 7 is a perspective view of a platen in accordance with the invention in which a rectangular frame 60 is mounted on a support plate 62 having a centrally disposed opening 64 above which a wedge card manipulator 66 is provided. Handles 68 are provided on plate 62 for moving the plate from one test station to another.

Manipulator 66 is mounted on orthogonal rods 70, 72 which are mounted to respective pairs of manipulators 74, and 76 which are mounted on opposing sides of platen 60. Thus, manipulator 66 is moved by rod 72 and manipulators 76 along one axis (X), while manipulator 66 is moved by rod 70, and manipulators 74 along another axis (Y). Manipulator 66 thus provides positioning along a single axis (Z). This is shown schematically in FIG. 8 which is a plan view of the platen and manipulator of FIG. 7.

Figure 9:
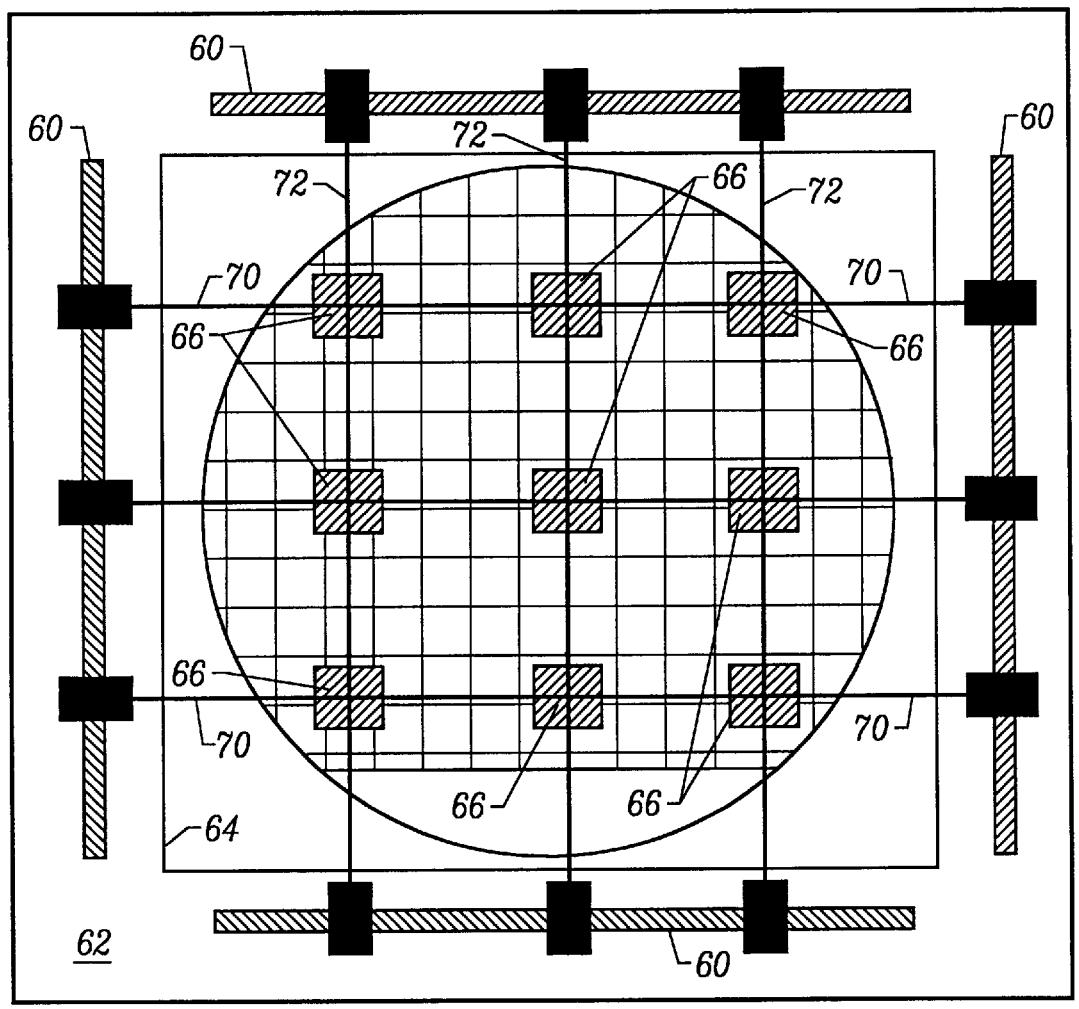
FIG. 9 illustrates the manipulation of a plurality of wedge cards in accordance with the invention using the platen of FIG. 7.

Alternatively, a plurality of X positioning rods 72 and Y positioning rods 70 can be employed as shown in FIG. 9 to position a plurality of individual manipulators 66.

Figure 8:
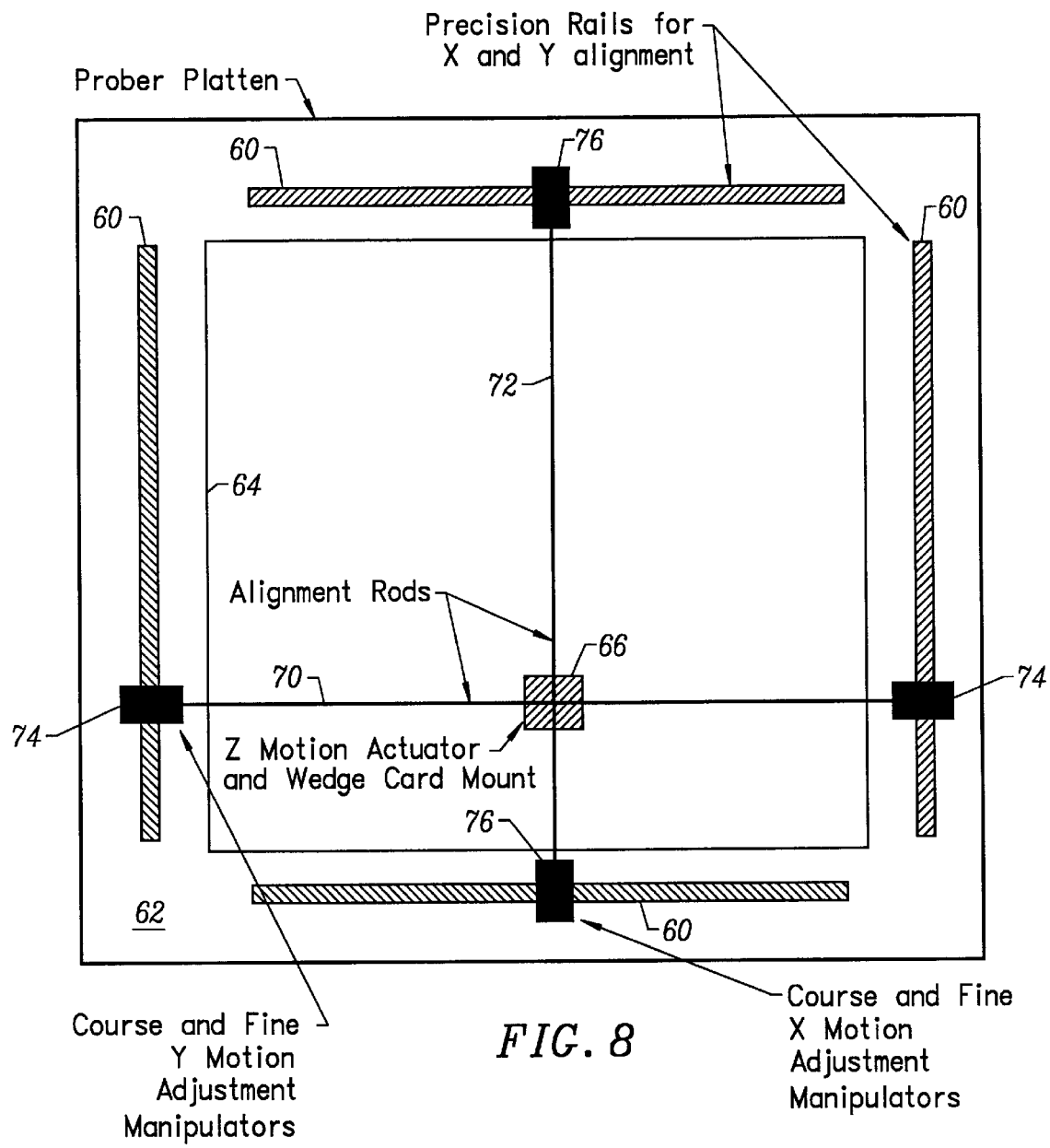
FIG. 8 illustrates the manipulation of one wedge card in accordance with the invention using the platen of FIG. 7.

In the embodiments of FIGS. 8, 9, distributed X and Y axis motion manipulators are employed which need not be positioned above the wafer undergoing tests. Further, fewer manipulators are required since a plurality of wedge cards can be controlled in two axes of motion by the same manipulators. In all embodiments of the invention, multiple dice on a wafer are simultaneously accessed, thereby enhancing the testing of multiple dice when extended test periods are required.

While the invention has been described with reference to specific embodiments, the descriptions are illustrative of the invention and are not to be construed as limiting the invention. Various modifications and applications may occur to those skilled in the art without departing from the true spirit and scope of the invention as defined by the appended claims.

What is claimed is:

1. A multiple probe wedge card for engaging contacts on a plurality of integrated circuit dice comprising:
    a card body having two opposing major surfaces,
    a plurality of needle probes mounted on and extending from said card body below a first major surface and aligned in two orthogonal directions (X, Y) with the probes being planarized below a first major surface,
    a manipulator contact centrally disposed on a second major surface whereby said plurality of needle probes are extendable from at least two sides of said body for simultaneously engaging at least two integrated circuits, and
    a manipulator attached to said manipulator contact for individually manipulating said card in one axis (Z).

2. The multiple probe wedge card as defined by claim 1 and further including a probe card for supporting a plurality of wedge cards and manipulators, said probe card having an opening through which needle probes extend for contacting integrated circuit dice, the manipulators for individual wedge cards being mounted on said probe card adjacent to said opening.

3. The multiple probe wedge card as defined by claim 1, and further including a platen for positioning around a semiconductor wafer, said platen including a first support rod and means for moving the first support rod in a first axis (X), a second support rod and means for moving the second support rod in a second axis (Y), said manipulator being mounted to said first support rod and second support rod and movable along the first axis and the second axis thereby, the manipulator providing movement along a third axis (Z).

4. The multiple probe wedge card as defined by claim 2 wherein said needle probes extend from four sides of said body for simultaneously engaging four integrated circuit dice.

5. A method of probing multiple integrated circuit dice on a semiconductor wafer comprising the steps of:
    a) providing a wedge card body having two opposing major surfaces with a plurality of needle probes mounted on and extending from said card body and aligned in two orthogonal directions (X, Y) with the probes planarized below a first major surface, b) providing a manipulator contact centrally disposed on a second major surface whereby said plurality of needle probes are extendable form at least two side of said body for engaging at least two integrated circuits simultaneously, and c) providing a manipulator for engaging the manipulator contact and moving the card body along one axis through the manipulator contact.

6. The method as defined by claim 5, wherein the manipulator moves the card body in three axes (X,Y,Z).

7. The method as defined by claim 5 and further including the steps of:

d) providing a platen which is positionable around a semiconductor wafer undergoing tests, a pair of manipulators mounted to the platen and movable along one axis (X), a second pair of manipulators mounted on said platen and movable along a second axis (Y), a first rod engaging the first pair of manipulators and a second rod engaging the second pair of manipulators, the card body being coupled to the first and second rods and movable along two axes (X,Y) thereby.

* * * * *